United States Patent
Xu et al.

(10) Patent No.: US 9,628,118 B2
(45) Date of Patent: Apr. 18, 2017

(54) ADAPTIVE ENVELOPE TRACKING FOR BIASING RADIO FREQUENCY POWER AMPLIFIERS

(71) Applicant: CoolStar Technology, Inc., Saratoga, CA (US)

(72) Inventors: Shuming Xu, Sunnyvale, CA (US); Wenhua Dai, San Jose, CA (US)

(73) Assignee: Coolstar Technology, Inc., Sunnyvale, CA (US)

( * ) Notice: Subject to any disclaimer, the term of this patent is extended or adjusted under 35 U.S.C. 154(b) by 0 days.

(21) Appl. No.: 14/815,680

(22) Filed: Jul. 31, 2015

(65) Prior Publication Data

US 2016/0036388 A1     Feb. 4, 2016

Related U.S. Application Data

(60) Provisional application No. 62/032,444, filed on Aug. 1, 2014, provisional application No. 62/038,159, filed on Aug. 15, 2014, provisional application No. 62/047,237, filed on Sep. 8, 2014.

(51) Int. Cl.
| | |
|---|---|
| *H04M 1/00* | (2006.01) |
| *H04B 1/04* | (2006.01) |
| *H03F 3/19* | (2006.01) |
| *H03F 1/02* | (2006.01) |

(Continued)

(52) U.S. Cl.
CPC ......... *H04B 1/0458* (2013.01); *H03F 1/0227* (2013.01); *H03F 1/0266* (2013.01); *H03F 3/005* (2013.01); *H03F 3/19* (2013.01); *H03F 3/245* (2013.01); *H03F 2200/102* (2013.01); *H03F 2200/451* (2013.01); *H03F 2200/555* (2013.01); *H04B 2001/0416* (2013.01)

(58) Field of Classification Search
CPC ...... H03F 2200/102; H03F 3/245; H03F 3/19; H03F 1/0222; H03F 2200/451; H03F 1/0227; H03F 3/24; H03F 2200/387; H03F 1/56; H03F 3/72; H03F 1/0277; H03F 3/21; H03F 3/195; H03F 1/025; H03F 2200/411; H03F 2203/7209
USPC ....................................................... 455/571
See application file for complete search history.

(56) References Cited

U.S. PATENT DOCUMENTS

| | | | | |
|---|---|---|---|---|
| 2012/0146731 | A1* | 6/2012 | Khesbak | H03F 1/0222 330/295 |
| 2012/0326783 | A1* | 12/2012 | Mathe | H03F 1/0227 330/251 |

(Continued)

*Primary Examiner* — Ajibola Akinyemi
(74) *Attorney, Agent, or Firm* — Otterstedt, Ellenbogen & Kammer, LLP

(57) ABSTRACT

An RF PA is designed to operate efficiently for average powers when biased at the system supply voltage, and uses an envelope tracking power supply to boost the bias voltage to maintain good efficiency at higher powers. As a result, for a majority of the time when transmitting average power signals, the RF PA bias voltage is the system-wide supply voltage (e.g. 3.4V in cell phones), which eliminates the need for stepping down voltages. The bias voltage is boosted during the less frequent times when higher power is needed. As a result, only a boost type of DC voltage converter is needed. The efficiency of the RF PA is therefore increased because voltage conversion is required less frequently and only when higher power RF signals are transmitted.

19 Claims, 8 Drawing Sheets

(51) Int. Cl.
*H03F 3/00* (2006.01)
*H03F 3/24* (2006.01)

(56) References Cited

U.S. PATENT DOCUMENTS

2013/0214862 A1* 8/2013 Presti .................. H03F 3/24
   330/151
2015/0333781 A1* 11/2015 Alon .................. H04B 1/0475
   370/277

* cited by examiner

ADAPTIVE ENVELOPE TRACKING FOR BIASING RADIO FREQUENCY POWER AMPLIFIERS

CROSS-REFERENCE TO RELATED APPLICATION(S)

This application claims priority under 35 U.S.C. §119(e) to U.S. Provisional Patent Application Ser. No. 62/032,444, "High Speed Envelope Tracking Power Amplifier," filed Aug. 1, 2014; U.S. Provisional Patent Application Ser. No. 62/038,159, "Adaptive Envelope Tracking," filed Aug. 15, 2014; and U.S. Provisional Patent Application Ser. No, 62/047,237, "High Voltage Power Amplifier Design," filed Sep. 8, 2014; which are incorporated herein by reference in their entirety.

BACKGROUND

1. Technical Field

The present disclosure relates to power amplifiers and, more specifically, to providing adaptive envelope tracking bias voltages for biasing radio frequency ("RF") power amplifiers.

2. Description of the Related Arts

RF power amplifiers, for example in cell phones, are used to transmit information in the form of modulated radio frequency electromagnetic waves. Power amplifiers are used in many applications such as WiFi, GPS, and the transmission of voice and data. Voice and data applications may also employ multiple frequency bands. The transmission distance is a function of the RF output power. The further the transmission distance, the higher the required output power, and the more battery power is consumed.

Power amplifiers ("PA") consume most of the battery power in many usage cases, for example when a cell phone constantly transmits data to the nearby cell towers. The existing power supply architecture in cell phones uses the system supply voltage (e.g., the battery voltage) as the maximum bias voltage to the power amplifiers. Under this concept, the PA is designed to operate at peak efficiently for maximum powers when biased at the system supply voltage. However, under this design, RF PAs have overall low efficiency in many applications, such as smartphones, tablets, etc. This is because, when the RF PA is biased at the system supply voltage, the system and RF PA are designed for efficiency only when there is an RF signal of maximum power. However, for most of the time, RF PAs do not operate at full power. The average power for an RF PA typically is 1/2 to 1/7 of its saturated power. Accordingly, a large amount of DC power is wasted when the RF PA operates at these lower powers.

To improve the RF PA efficiency at lower power levels, envelope tracking (ET) or average power tracking (APT) techniques are used. Envelope tracking adjusts the bias voltage applied to the PA to increase the PA operating efficiency. In other words, the power supply voltage is adjusted to ensure that the PA is operating at peak efficiency for the power required at each instant of transmission. The envelope is the magnitude of the modulated RF signal. The speed of the envelope variation is typically in the MHz range and increases in wider bandwidth modulation applications. One approach is to use a linear regulator (e.g., LDO) and a buck-boost DC-converter. However, this approach has many disadvantages. The PA's overall efficiency is compromised because of the linear regulator's low efficiency. Moreover, when the bandwidth of LTE or other RF signals increases (e.g., reaching 40 MHz or 60 MHz under carrier aggregation), linear regulators typically will have difficulty to meet the signal envelope speed, and degradations in linearity may become unacceptable.

Furthermore, PAs must meet linearity requirements at high output power while operating at system supply voltage (e.g., 3.4V in cell phones). Cell phones output high power less frequently than low power, and PAs in cellphones often step down the supply voltage in order to bias the PA at a point that increases the efficiency. However, stepping down the supply voltage induces power loss. The lower the output voltage is, the lower the efficiency of the envelope tracking power supply system.

Accordingly, there is a need for PAs to work more efficiently across a range of power conditions.

SUMMARY

In one aspect, an RF PA is designed to operate efficiently for average powers when biased at the system supply voltage, and uses an envelope tracking power supply to boost the bias voltage to maintain good linearity at higher powers. As a result, for a majority of the time when transmitting average power signals, the RF PA bias voltage is the system-wide supply voltage (e.g. 3.4V in cell phones), which eliminates the need for stepping down voltages. The bias voltage is boosted during the less frequent times when higher power is needed. As a result, only a boost type of DC voltage converter is needed. The efficiency of the RF PA is therefore increased because voltage conversion is required less frequently and only when higher power RF signals are transmitted.

In one embodiment, an RF PA system includes an envelope tracking power supply that has a voltage conversion architecture, which includes a boost DC converter and a capacitive network. The envelope tracking power supply can increase the bias voltage instantaneously with little power loss as well as providing a steady boosted bias voltage when needed, by switching the capacitive network and by regulating the boost converter. The capacitive network allows the envelope tracking power supply to track the envelope speed of RF signals while using a boost DC converter that operates at a frequency lower than the RF signal. The power loss of the voltage conversion architecture is reduced because there is no step down voltage conversion, so the overall efficiency of the envelope tracking power supply is higher than conventional envelope tracking systems.

Other aspects include devices, components, systems, applications, improvements, variations, modifications, methods, processes and other technologies related to the foregoing.

BRIEF DESCRIPTION OF THE DRAWINGS

The teachings of the present disclosure can be readily understood by considering the following detailed description in conjunction with the accompanying drawings.

DETAILED DESCRIPTION OF EMBODIMENTS

The Figures FIG.) and the following description relate to embodiments of the present disclosure by way of illustration only. The features and advantages described in the specification are not all inclusive and, in particular, many additional features and advantages will be apparent to one of ordinary skill in the art in view of the drawings and specification. Moreover, it should be noted that the language used in the specification has been principally selected for adability and instructional purposes, and may not have been selected to delineate or circumscribe the inventive subject matter.

Reference will now be made in detail to several embodiments of the present disclosure, examples of which are illustrated in the accompanying figures. It is noted that wherever practicable similar or like reference numbers may be used in the figures and may indicate similar or like functionality. The figures depict embodiments of the present disclosure for purposes of illustration only. One skilled in the art will readily recognize from the following description that alternative embodiments of the structures and methods illustrated herein may be employed without departing from the principles of the embodiments of the disclosure described herein.

Figure 1:
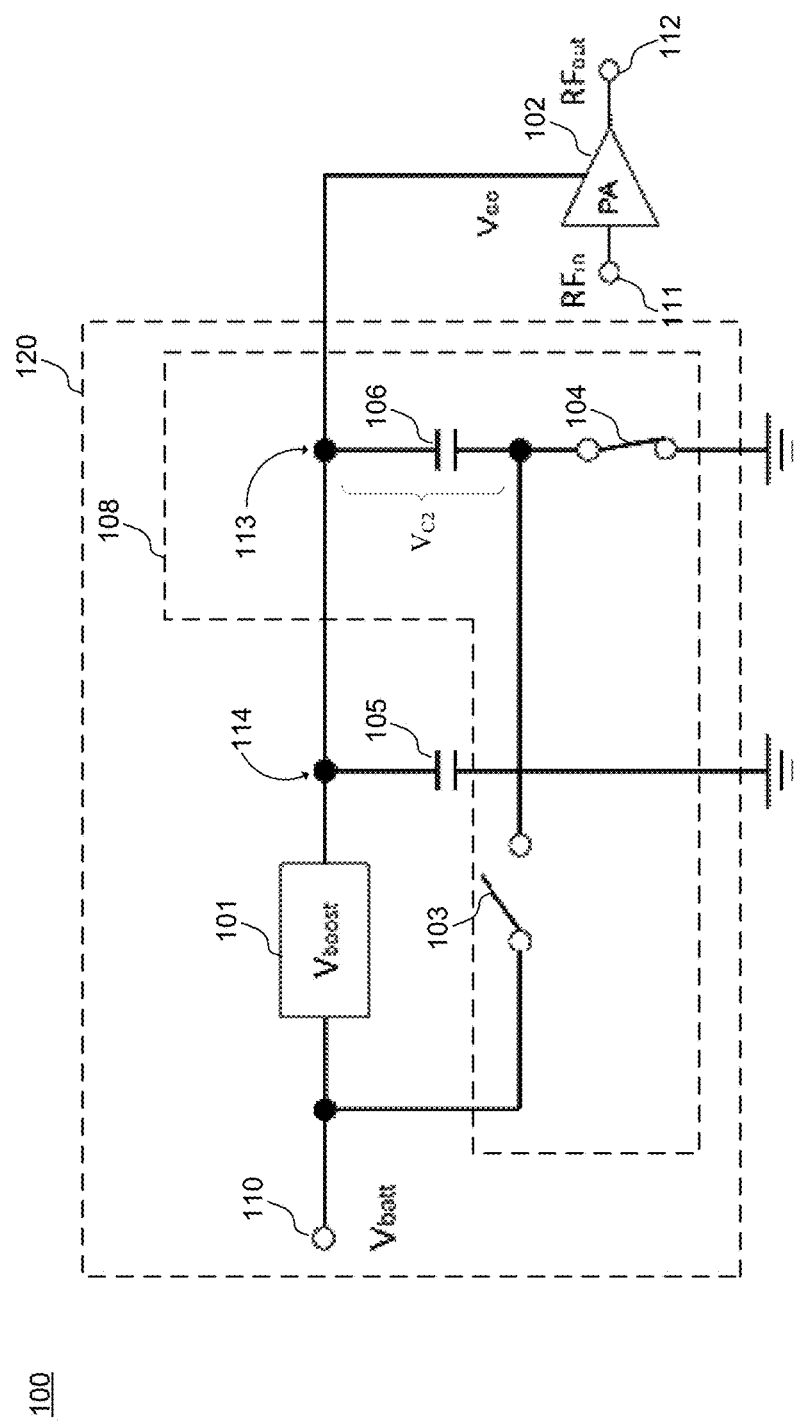
FIG. 1 is a block diagram of an example high-speed envelope tracking radio frequency power amplifier system, according to one embodiment.

FIG. 1 is a block diagram of an example high-speed envelope tracking radio frequency power amplifier system ("ET PA") 100, according to one embodiment. The illustrated ET PA 100 comprises a high-speed envelope tracking power supply 120 and an RF PA 102. The envelope tracking power supply 120 is configured to provide a bias voltage Vcc to the RF PA 102 and comprises a boost direct current ("DC") converter 101 plus an output capacitor 105, a capacitive network 108, and a controller (not shown). The capacitive network 108 comprises switches 103 and 104, and capacitor 106. The capacitor 105 balances the voltage ripple in the output voltage of and regulates the response speed of the boost DC converter 101. The controller controls the switches 103 and 104 as well as regulates the operations (i.e., switching on and off switches of the boost DC converter 101) of the boost DC converter 101. The controller typically is implemented as circuitry. The switches 103 and 104 may be MOSFET switches, silicon CMOS, SOI, or HEMT etc.

The ET PA 100 includes ports 110, 111 and 112. The input DC voltage, which is the system supply voltage $V_{batt}$, is received at the port 110. The RF PA 102 receives an input RF signal $RF_{in}$ at the port 111 and outputs the output RF signal $RF_{out}$ at the port 112. The output of the envelope tracking power supply 120 is coupled to the RF PA 102. The envelope tracking power supply 120 provides the DC bias voltage Vcc to bias the RF PA 102, which amplifies the input signal $RF_{in}$ to the amplified output signal $RF_{out}$. The RF PA 102 is designed to operate efficiently for average power levels when biased at the system supply voltage, i.e., when Vcc=$V_{batt}$. The average power level typically is 20-30% of the peak power and may be around 200 mW for many mobile devices. In many applications, the system supply voltage $V_{batt}$ is the voltage supplied by a battery source for a mobile device.

Within the envelope tracking power supply 120, the boost DC converter 101 is coupled between the input DC voltage $V_{batt}$ and the RF power amplifier 102. The boost DC converter 101 is configured to boost the input DC voltage $V_{batt}$ to a higher voltage, which is then used as the DC bias voltage Vcc for biasing the RF PA 102. The switching frequency of the boost DC converter 101 typically is in the MHz range, for example a couple MHz. The DC bias voltage Vcc increases as the duty cycle D of the boost DC converter 101 increases. Moreover, the capacitive network 108 is also coupled between the port 110 and the bias port for the RF power amplifier 102. The capacitive network 108, when coupled, is configured to provide a boosting voltage in series with the input DC voltage $V_{batt}$, thereby to instantaneously boost the DC bias voltage Vcc. The RF PA 102 is accordingly biased by voltages at different levels that meet input RF signal's envelope speed and can amplify RF signals at different levels while maintaining the operating efficiency. As such, the ET PA's 100 operating efficiency is improved.

Because the RF PA 102 is designed to be efficient using a bias voltage Vcc=$V_{batt}$ at the average power level of the input RF signal, when a higher output power is desired, the DC bias voltage Vcc supplied to the RF PA 102 is increased to be higher than the input voltage $V_{batt}$. In other words, the DC bias voltage Vcc supplied to the RF PA 102 at the highest power is higher than the system voltage $V_{batt}$ (i.e. the battery voltage or a system wide voltage). Conversely, the lowest bias voltage Vcc is the system supply voltage $V_{batt}$ so there is no need for a voltage step down converter.

When the input RF signal $RF_{in}$ level is low, the ET PA 100 operates at a low power mode, where the envelope tracking power supply 120 provides the system supply voltage (i.e., the input DC voltage $V_{batt}$) to bias the RF PA 102. The capacitive network 108 is decoupled from the input DC voltage $V_{batt}$ and the boost DC converter 101 is regulated to operate at a lower duty cycle D1 (e.g., 0%). The DC bias voltage Vcc equals the input DC voltage $V_{batt}$. During the low power mode, the switch 104 is on and the switch 103 is off, as shown in FIG. 1. The capacitor 106 is charged by the DC bias voltage Vcc such that the voltage $V_{c2}$ across the capacitor 106 equals to the input DC voltage $V_{batt}$.

When the input RF signal's $RF_{in}$ level is high, the envelope power supply 100 operates at a high power mode, where the envelope tracking power supply 120 provides a high voltage (e.g., $2V_{batt}$) to bias the RF PA 102. When the input RF signal $RF_{in}$ transitions to the high level, the controller couples the capacitive network 108 to the input DC voltage $V_{batt}$ and regulates the boost DC converter 101 to operate at a higher duty cycle D2 (e.g., 50%). Accordingly, the DC bias voltage Vcc is increased and the RF PA 102 is ensured to amplify the input RF signal $RF_{in}$. When the input RF signal $RF_{in}$ transitions to the high level, the controller turns off the switch 104 and turns on the switch 103 to instantaneously increase the DC bias voltage Vcc such that the DC bias voltage Vcc follows the input RF signal's envelope speed. The DC bias voltage Vcc is instantaneously boosted by the boosting voltage $V_{C2}$ across the capacitor 106, because the boosting voltage $V_{c2}$ is in series with the input DC voltage $V_{batt}$. In the illustrated example, the DC bias voltage Vcc is increased to $2V_{batt}$, twice the input DC voltage $V_{batt}$. At the same time, the capacitor 106 supplies a current to the RF PA 102. As such, the RF PA 102 is ensured to continuously amplify the input RF signal $RF_{in}$ and to output an output RF signal $RF_{out}$. In some cases, the DC bias voltage Vcc may be a little lower than $2V_{batt}$ because some charges in the capacitor 106 may be transferred to the capacitor 105 such that the nodes 113 and 114 are at the same electric potential Vcc. The ratio between the capacitors 105 and 106 typically is in the range of 1:10 to 1:5.

The controller also increases the duty cycle D of the boost DC converter 101 (e.g., from D1 to D2) to increase the output voltage of the boost DC converter 101, when the input RF signal $RF_{in}$ transitions to the high level. The DC bias voltage Vcc equals to the sum of the voltage $V_{c2}$ across the capacitor 106 and the input voltage $V_{batt}$. When the output voltage of the boost DC converter 101 increases to a level that equals to a voltage that is the sum of the input DC voltage $V_{batt}$ and the voltage $V_{C2}$ across the capacitor 106, the boost DC converter 101 replaces the capacitor 106 to provide a current to the RF PA 102. The controller regulates the boost power converter 101 to operate at the higher duty cycle D2 when the ET PA operates at the high power mode. As such, the RF PA 102 can work at high power levels continuously.

When the envelope power supply switches to the low power mode from the high power mode, the controller reduces the duty cycle D of the boost DC converter 101 from D2 to D1 (e.g., from 50% from 0%) and decouples the switch network 108 from the input DC voltage $V_{batt}$. When the input RF signal $RF_{in}$ transitions to the low level, the controller turns off the switch 103 and turns on the switch 104 to decouple the capacitive network 108 from the input port 110. The DC bias voltage Vcc provided to the RF PA 102 is reduced to $V_{batt}$.

The illustrated ET PA 100 tracks the RF signal's envelope speed and has high operating efficiency. This is because the DC bias voltage Vcc can be doubled almost instantaneously by switching the capacitor 106 to be in series with the input DC voltage $V_{batt}$, at a much higher speed than a linear regulator. In addition, the loss is also lower because of the high quality factors of the capacitors 105 and 106. The DC bias voltage Vcc supplied to the RF PA 102 can be increased at a high speed and a high current is provided to the RF PA 102 by balancing the value of the capacitors 105 and 106.

Figure 2:
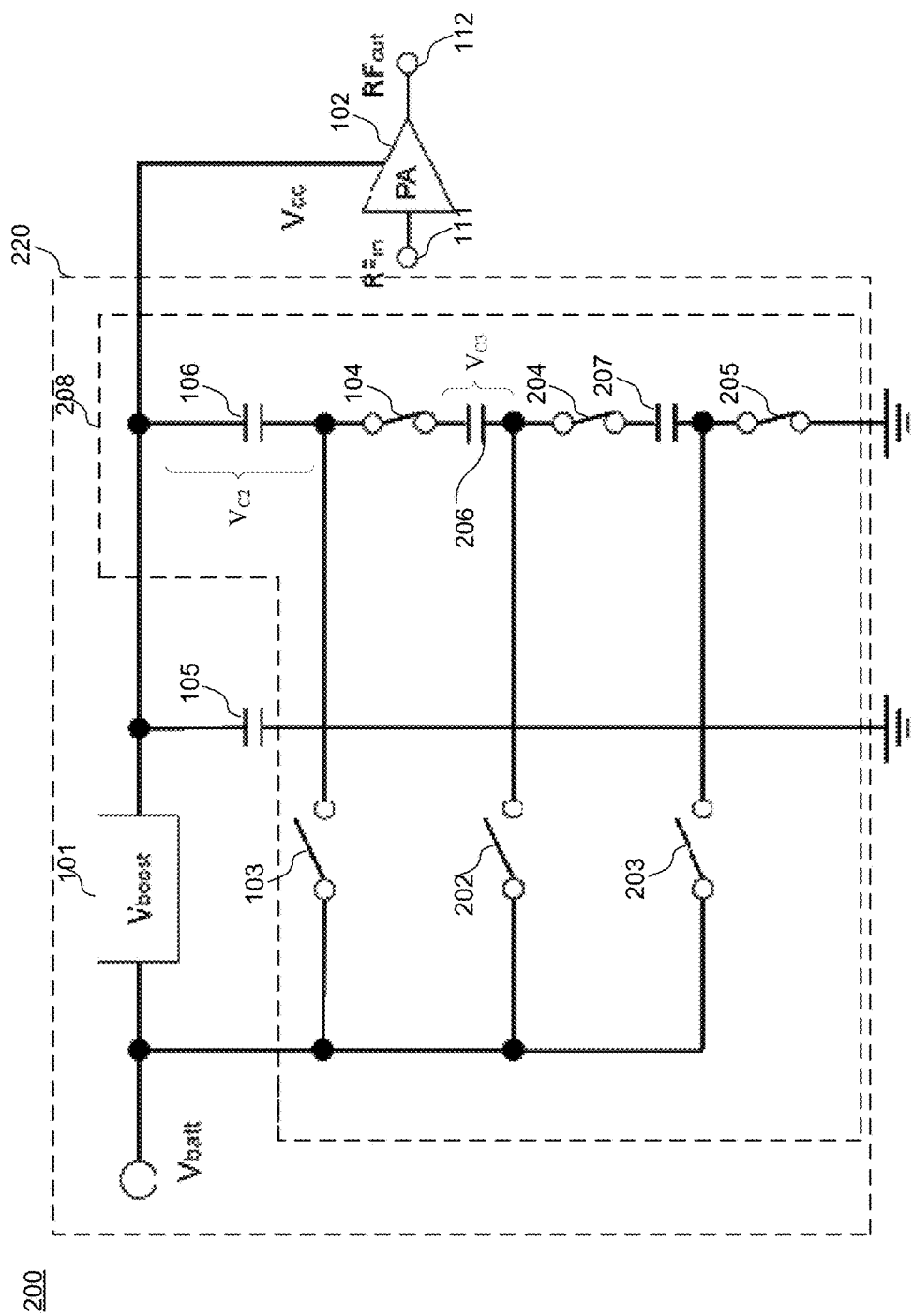
FIG. 2 is a block diagram of an example high-speed envelope tracking radio frequency power amplifier system, according to another embodiment.

FIG. 2 is a block diagram of an example high-speed envelope tracking radio frequency power amplifier system ("ET PA") 200, according to another embodiment. The illustrated ET PA 200 comprises a high-speed envelope tracking power supply 220 and an RF PA 102. The envelope tracking power supply 220 is configured to provide a bias voltage Vcc to the RF PA 102 and comprises a boost direct current ("DC") converter 101 plus output capacitor 105, a capacitive network 208, and a controller (not shown). The capacitive network 208 includes a capacitor and switch ladder, with capacitors 106, 206 and 207. The envelope tracking power supply 220 achieves finer tuning of the DC bias voltage Vcc, compared to the envelope tracking power supply 120 illustrated in FIG. 1 The switches in the capacitor and switch ladder 208 may be MOSFET switches, silicon CMOS, SOI, or HEMT etc. The capacitors 106, 206, and 207 may have the same or different capacitance. When the capacitors 106, 206, and 207 have the same capacitance, they are charged to have the same voltage. For example, when the ET PA 200 operates at the low power mode, the controller decouples the capacitive network 208 from the input DC voltage $V_{batt}$. The switches 104, 204, and 205 are turned on and the switches 103, 202, and 203 are turned off. The capacitors 106, 206, and 207 are each charged to a third of the DC voltage, or $V_{batt}/3$, when they have the same capacitance.

When the incoming signals $RF_{in}$ are high power signals, the ET PA 200 operates at a high power mode. The controller may couple the capacitive network 208 to the input DC voltage $V_{batt}$. When being coupled to the input DC voltage $V_{batt}$, the capacitive network 208 may be configured to provide different levels of boosting voltages (e.g., $1/3*V_{batt}$, $2/3*V_{batt}$, or $V_{batt}$). The DC bias voltage Vcc can be increased instantaneously to various levels (e.g., $4/3*V_{batt}$, $5/3*V_{batt}$, or $2V_{batt}$) to meet different amount of power needed by the RF PA 102. For example, when the controller configures the capacitive network 208 such that the switches 202, 104 are on and the switches 103 and 203 through 205 are off, the voltage $V_{c2}$ across the capacitor 106 is in series with the voltage $V_{c3}$ across the capacitor 206, both of which are in series with the input DC voltage $V_{batt}$. As a result, the DC bias voltage Vcc equals to $V_{batt}+(2/3)*V_{batt}$, when the capacitors 106 and 206 have the same capacitance. Other architectures of switch and capacitor ladders can also be used.

Figure 3A:
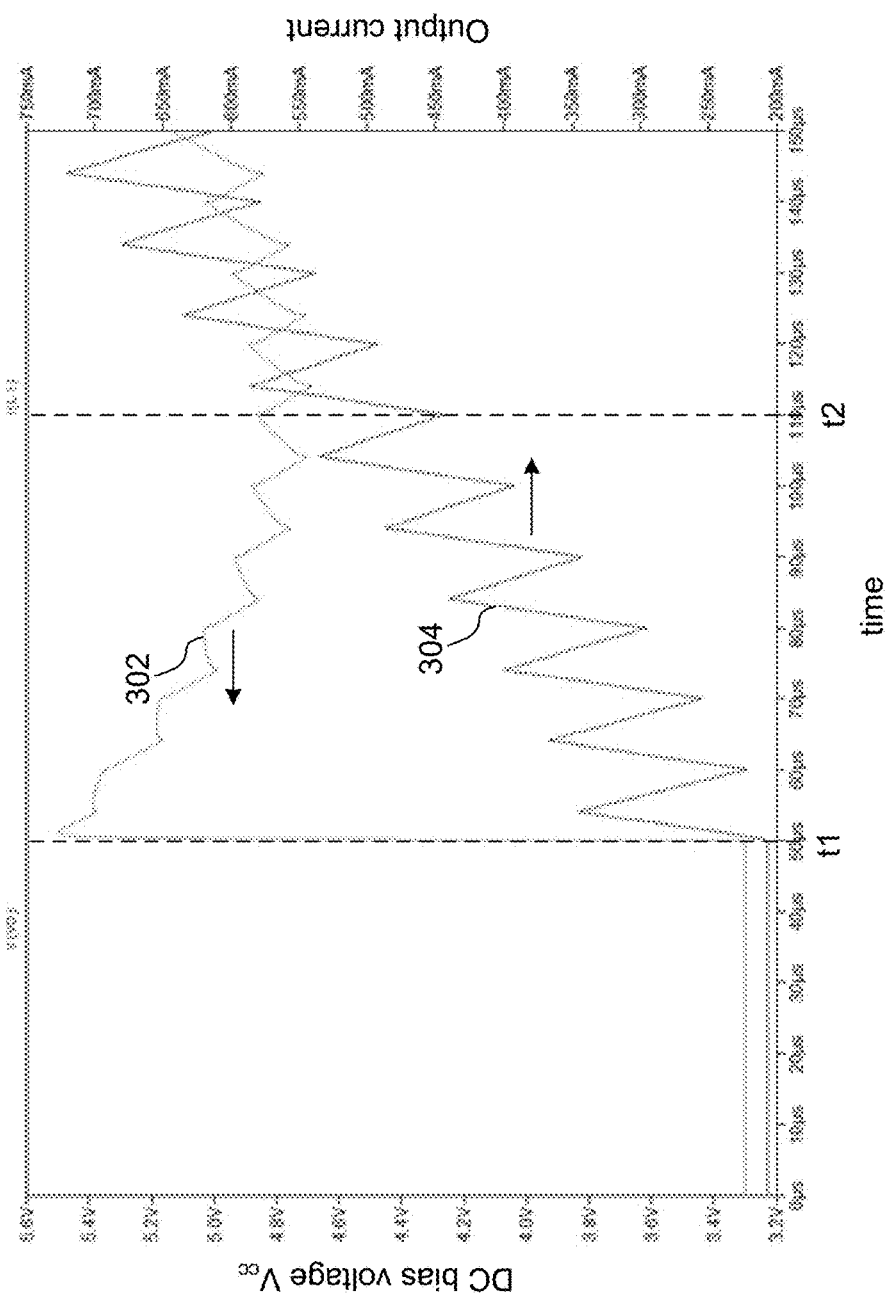
FIGS. 3A and 3B show operation waveforms of example high-speed envelope tracking radio frequency power amplifier systems.

FIG. 3A shows operation waveforms of an example high-speed envelope tracking radio frequency power amplifier system ("ET PA"), according to one embodiment. The ET PA includes an envelope tracking power supply that includes a boost DC converter of which the switching frequency is 100 KHz. The waveforms 302 and 304 illustrate the DC bias voltage (i.e., Vcc) provided to the RF PA and the output current of the boost DC converter, respectively. Before the time point $t_1$ at 50 us, the boost DC converter (e.g., the boost DC converter 101) operates at a duty cycle of 0%. As illustrated by the waveform 302, the DC bias voltage supplied to the RF PA is at 3.3V during this time. At the time point 50 us, the DC bias voltage supplied to the RF PA immediately jumps to 5.5V due to the boosting voltage across a capacitor (e.g., the capacitor 106) being coupled in series with the input DC voltage. Subsequently, during the time period between $t_1$ and $t_2$, the DC bias voltage drops gradually while the capacitor (e.g., the capacitor 106) discharges and provides a current to the PA. At the time point $t_2$ at 110 us, the DC bias voltage stops decreasing and starts to increase, when the boost DC converter starts to provide the DC bias voltage and the current to the RF PA.

Figure 3B:
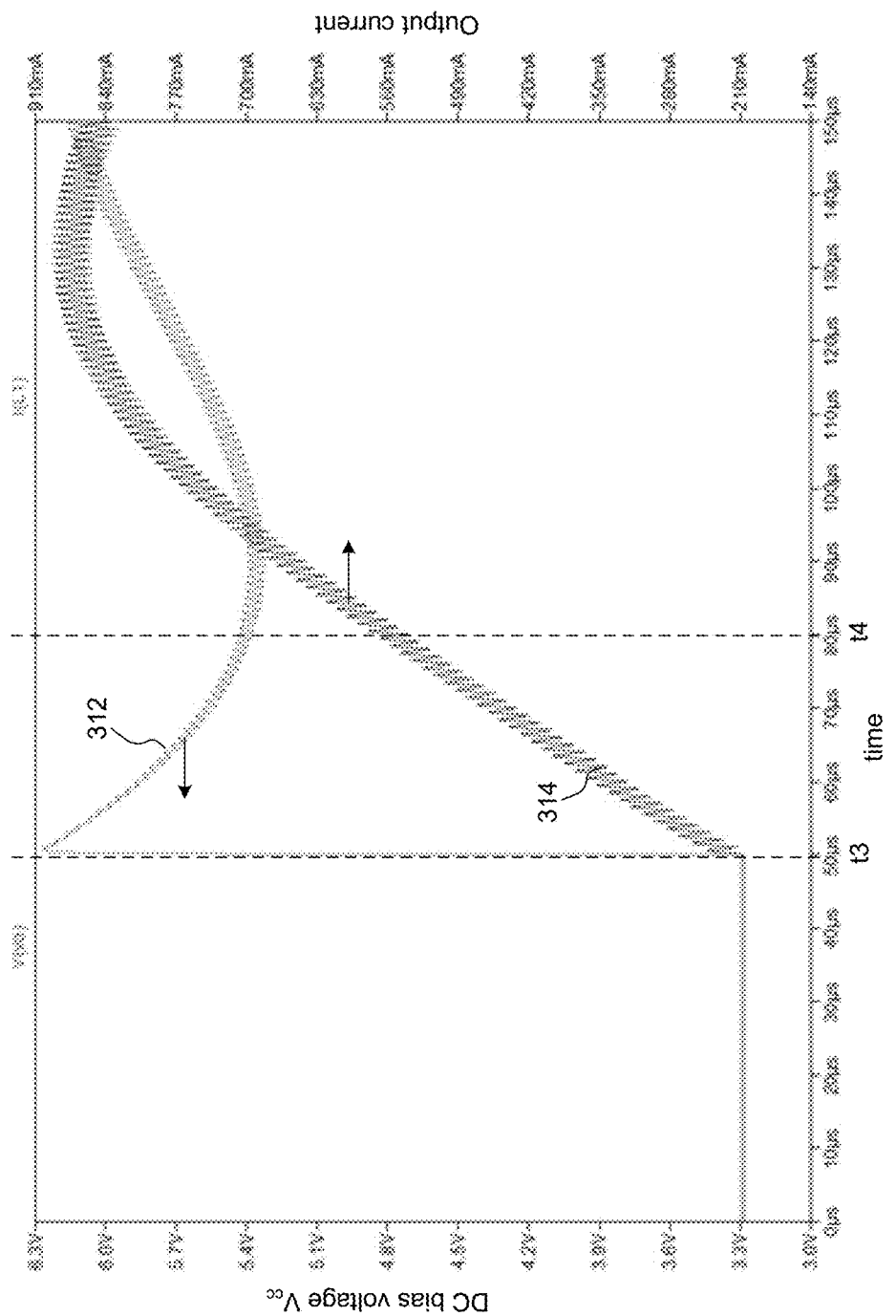

FIG. 3B shows operation waveforms of an example high-speed envelope tracking radio frequency power amplifier system ("ET PA"), according to another embodiment. The ET PA includes an envelope tracking power supply that includes a boost DC converter of which the switching frequency is 1 MHz. The waveforms 312 and 314 illustrate the DC bias voltage (i.e., Vcc) provided to the RF PA and the output current of the boost DC converter, respectively. At the time point $t_3$ at 50 us, the DC bias voltage supplied to the PA immediately jumps to 6.3V from 3.3V due to the boosting voltage across a capacitor (e.g., the capacitor 106) being coupled in series with the input DC voltage. Subsequently, during the time period between $t_3$ and $t_4$, the DC bias voltage drops gradually while the capacitor (e.g., the capacitor 106) discharges and provides a current to the PA. However, because the boost DC converter operates at a higher switching frequency than 100 KHz, the output voltage stops decreasing at time point $t_4$ at around 80 us. With the boost DC converter operating at a higher switching frequency, the DC bias voltage supplied to the RF PA is increased faster, and thereby shortens the amount of time that the boost DC converter takes to provide a current to the RF PA.

Figure 4:
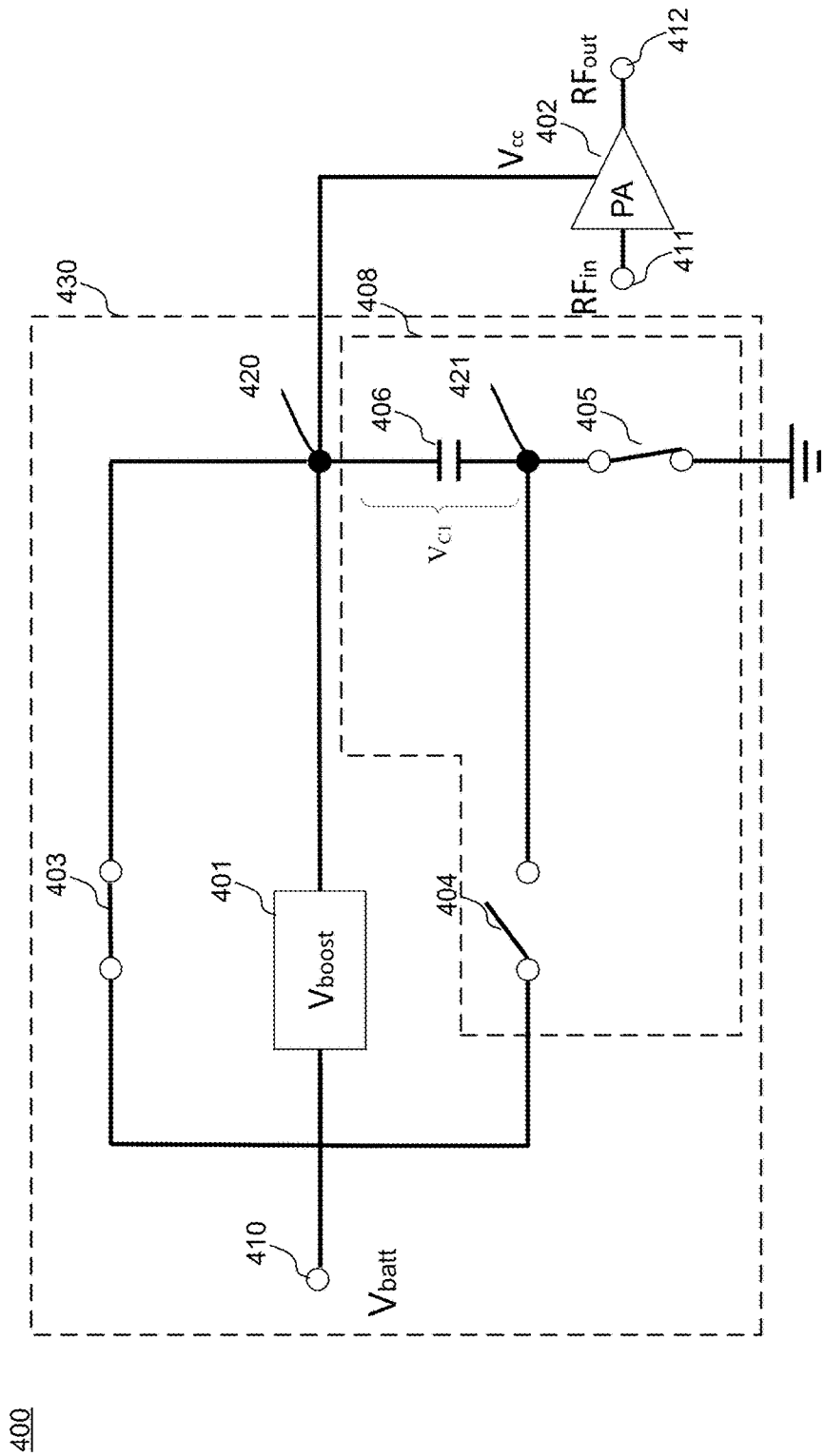
FIG. 4 is a block diagram of an example high-speed envelope tracking radio frequency power amplifier system, according to yet another embodiment.

FIG. 4 is a block diagram of an example high-speed envelope tracking radio frequency power amplifier system ("ET PA") 400, according to yet another embodiment. The illustrated ET PA 400 comprises a high-speed envelope tracking power supply 430 and an RF PA 402. The envelope tracking power supply 430 is configured to provide a bias voltage Vcc to the RF PA 402 and comprises a boost DC converter 401, a bypass switch 403, a capacitive network 408, and a controller (not shown). The capacitive network 408 comprises switches 404 and 405 and a capacitor 406. The controller controls the switches 403 through 405 as well as regulates the operations (i.e., switching on and off switches) of the boost DC converter 401. The controller typically is implemented as circuitry. The switches 403 through 405 may be MOSFET switches, silicon CMOS, SOI, or HEMT etc.

The ET PA 400 includes ports 410, 411 and 412. The input DC voltage $V_{batt}$ (e.g., the battery voltage from the phone board, or other system-wide supply voltage) is received at the port 410. The RF PA 402 receives an input RF signal $RF_{in}$ at the port 411 and outputs the output RF signal $RF_{out}$ at the port 412. The bypass switch 403 is coupled between the port 410 and the RF power amplifier 402. The bypass switch 403 is on when the envelope power supply 400 operates in the low-power mode. The output of the envelope tracking power supply 430 is coupled to the RF PA 402. The envelope tracking power supply 430 provide the DC bias voltage Vcc to bias the RF PA 402, which amplifies the input signal $RF_{in}$ to the amplified output signal $RF_{out}$. The RF PA 402 is configured to operate at a low power range with a high operating efficiency without the need to reduce the voltage below the input DC voltage $V_{batt}$ (e.g., 3.4V).

Within the envelope tracking power supply 430, the boost DC converter 401 is coupled between the port 410 and the RF power amplifier 402. The capacitive network 408 is also coupled between the port 410 and the RF PA 402. The boost DC converter 401 and the capacitive network 408 are configured to provide a DC bias voltage Vcc to bias the RF power amplifier 402, which amplifies the input signal $RF_{in}$ to the amplified output signal $RF_{out}$. The capacitive network 408, when coupled, is configured to provide a boosting voltage in series with the input DC voltage $V_{batt}$, thereby to instantaneously boost the DC bias voltage Vcc. The capacitor 406 and the switches 404 and 405 are configured such that the capacitor 406 can be coupled to be in series with the input DC voltage $V_{batt}$ via regulating the on and off of the switches 404 and 405. The RF PA 402 is designed to operate efficiently at the average power level of the input RF signals $RF_{in}$ when biased at the input voltage $V_{batt}$.

When the input RF signal $RF_{in}$ is at a low level, the ET PA 400 operates at the low power mode, where the envelope tracking power supply 430 provides a low voltage (i.e., the input DC voltage $V_{batt}$) to bias the RF PA 102. The capacitive network 408 is decoupled from the input DC voltage $V_{batt}$ and the bypass switch 403 is on. The capacitor 406 is charged by the input DC voltage $V_{batt}$. During the low power mode, the switch 404 is off and the switch 405 is on. In addition, the controller regulates the boost converter 401 to operate at a lower duty cycle D1 (e.g., 0%). The voltage drop across the boost DC converter 401 is minimized because the switch 403 is on.

When the input RF signal $RF_{in}$ level is high, the envelope power supply 400 operates at a high power mode, where the envelope tracking power supply 430 provides a high voltage (e.g., 2Vbatt) to bias the RF PA 402. When the input RF signal $RF_{in}$ transitions to the high level, the controller couples the capacitive network 408 to the input DC voltage $V_{batt}$, turns off the bypass switch 403, and regulates the boost DC converter 401 to operate at a high duty cycle D2 (e.g., 50%). Accordingly, the DC bias voltage Vcc is increased and the RF PA 402 is ensured to amplify the input RF signal $RF_{in}$. When the input RF signal $RF_{in}$ transitions to the high level, the controller turns off the switches 403 and 405 and turns on the switch 404 thereby to instantaneously increase the DC bias voltage Vcc such that the DC bias voltage Vcc follows the input RF signal's envelope speed. The DC bias voltage Vcc is instantaneously boosted by the boosting voltage $V_{c1}$ across the capacitor 406, because the boosting voltage $V_{c1}$ is in series with the input DC voltage $V_{batt}$. In the illustrated example, the DC bias voltage Vcc is increased to $2V_{batt}$, twice the input DC voltage $V_{batt}$, and the RF PA 402 saturation power is quadrupled. As such, the RF PA 402 operates linearly and amplifies input RF signal $RF_{in}$, at high levels.

When the capacitor 406 is first coupled in series with the input DC voltage $V_{batt}$, the capacitor 406 is discharged and provides a current to the RF PA 402. The voltage $V_{c1}$ across the capacitor 406 decreases at a higher rate with smaller capacitance. Because a lower than desired DC bias voltage Vcc can cause the distortion in the output RF signal $RF_{out}$, the controller increases the duty cycle of the boost DC converter 401 thereby to increase the output voltage of the boost DC converter 401 to stabilize the DC bias voltage Vcc provided to the RF PA 402. When the input RF signal $RF_{in}$ transitions to the low level, the ET PA 400 returns back to the low power mode. The envelope tracking power supply 430 reduces the DC bias voltage provided to the RF PA 402 by decoupling the capacitive network 408 from the input DC voltage $V_{batt}$ and turning on the bypass switch 403. The DC bias voltage Vcc can be decreased to the low level (e.g., $V_{batt}$) instantaneously by turning on the bypass switch 403. The controller turns off the switch 404 and subsequently turns on the bypass switch 403 to bias the RF PA 402 with the input DC voltage $V_{batt}$. Subsequently, the controller turns on the switch 405 to charge the capacitor 406. The controller further reduces the duty cycle of the boost DC converter 101 from D2 to D1 (e.g., from 50% from 0%).

Figure 5:
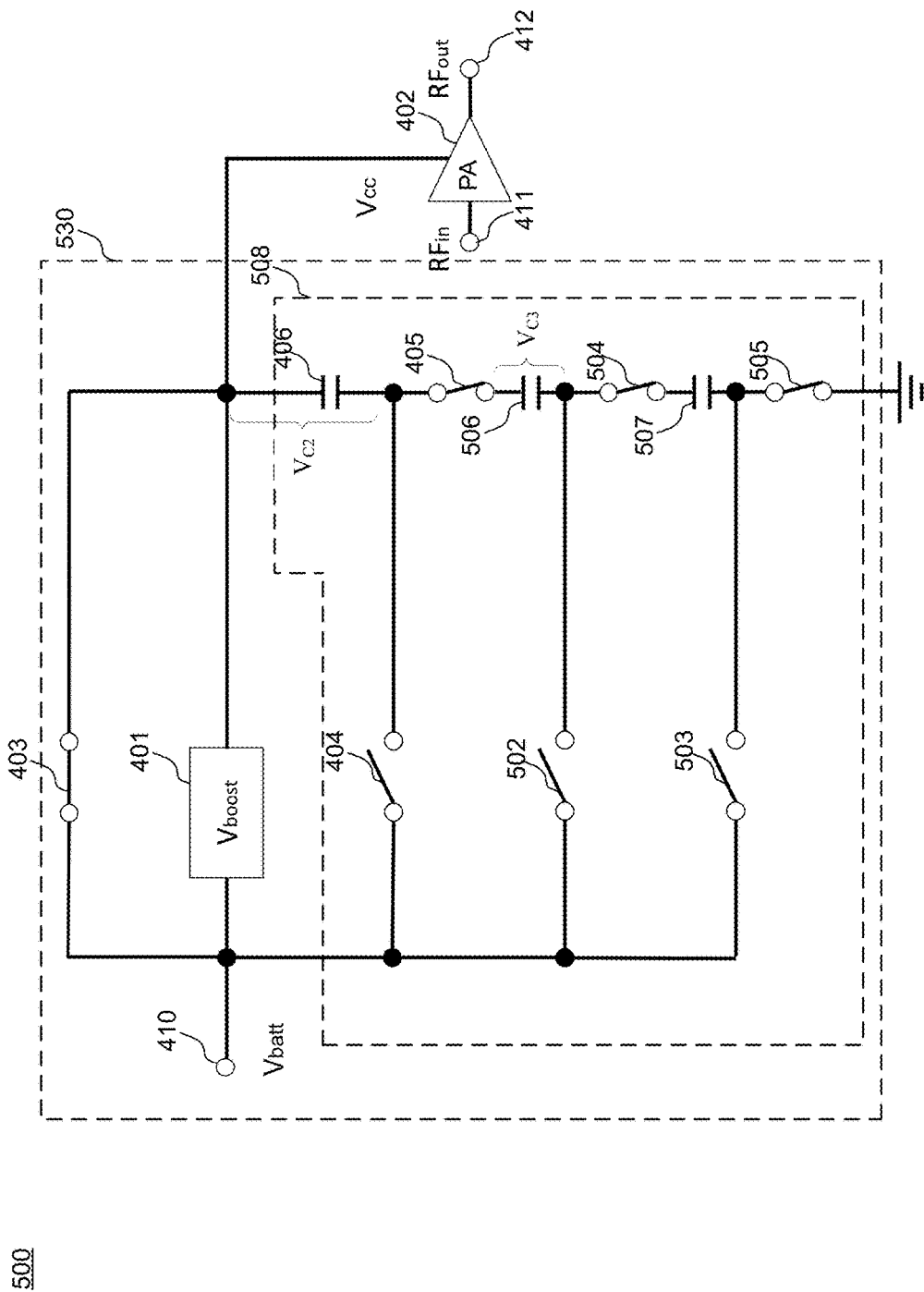
FIG. 5 is a block diagram of an example high-speed envelope tracking radio frequency power amplifier system, according to yet another embodiment.

FIG. 5 is a block diagram of an example high-speed envelope tracking radio frequency power amplifier system ("ET PA") 500, according to yet another embodiment. The illustrated ET PA 500 comprises a high-speed envelope tracking power supply 530 and an RF PA 402. The envelope tracking power supply 530 is configured to provide a bias voltage Vcc to the RF PA 402 and comprises a boost DC converter 401, a bypass switch 403, a capacitive network 508, and a controller (not shown). The capacitive network 508 includes a capacitor and a switch ladder. The envelope tracking power supply 530 achieves finer tuning of the DC bias voltage Vcc, compared to the envelope tracking power supply 430 illustrated in FIG. 4. The switches in the capacitor and switch ladder may be MOSFET switches, silicon CMOS, SOI, or HEMT etc. The capacitors 406, 506, and 507 may have the same or different capacitance. As an example, when the capacitors 406, 506, and 507 have the same capacitance, they are charged to have the same voltage. For example, when the ET PA 500 operates at the low power mode, the controller decouples the capacitive network 508 from the input DC voltage $V_{batt}$. The switches 405, 504, and 505 are turned on and the switches 404, 502, and 503 are turned off. The capacitors 406, 506, and 507 are each charged to a third of the DC voltage, $1/3*V_{batt}$.

The illustrated envelope power supply 500 is similar to the envelope power supply 400 illustrated in FIG. 4, and thus the details of the ports 410-412, the bypass switch 403, the boost DC converter 401, and the RF PA 402 are omitted for the sake of brevity. When the incoming signals $RF_{in}$, are low power signals, the ET PA 500 operates at the low power mode, the capacitive network 508 is decoupled from biasing the RF PA 402. The bypass switch 403 is on and the RF PA 402 is biased by the input DC voltage $V_{batt}$. When the incoming signals $RF_{in}$ transitions into high power signals, the ET PA 500 transitions to operate at a high power mode. The controller turns off the bypass switch 403 and couples the capacitive network 508 to the input DC voltage $V_{batt}$. When coupled to the input DC voltage $V_{batt}$, the capacitive network 508 may be configured to provide different levels of boosting voltage (e.g., $1/3*V_{batt}$, $2/3*V_{batt}$, or $V_{batt}$). The DC bias voltage $V_{cc}$ can be increased instantaneously to various levels (e.g., $4/3*V_{batt}$, $5/3*V_{batt}$, or $2*V_{batt}$) to meet different amount of power needed by the RF PA 402 to maintain linear operation. For example, when the controller configures the capacitive network 508 such that the switches 502 and 405 are on, and the switches 404 and 503 through 505 are off, the voltage $V_{c2}$ across the capacitors 406 is coupled in series with the voltage $V_{c3}$ across the capacitor 506, both of which are coupled in series with the input DC voltage $V_{batt}$. As a result, the DC bias voltage $V_{cc}$ equals to $V_{batt}+(2/3)*V_{batt}$, when the capacitors 406 and 506 have the same capacitance. Other architectures of switch and capacitor ladders can also be used.

When the ET PA 500 reverts back to the low power mode, the controller decouples the capacitive network 508 and turns on the bypass switch 403. The controller turns off the switches 404, 502 and 503 and subsequently turns on the bypass switch 403 to couple the RF PA 402 to be biased by the input DC voltage $V_{batt}$. Subsequently, the controller turns on the switches 405, 504 and 505 to charge the capacitors 406, 506, and 507.

Figure 6:
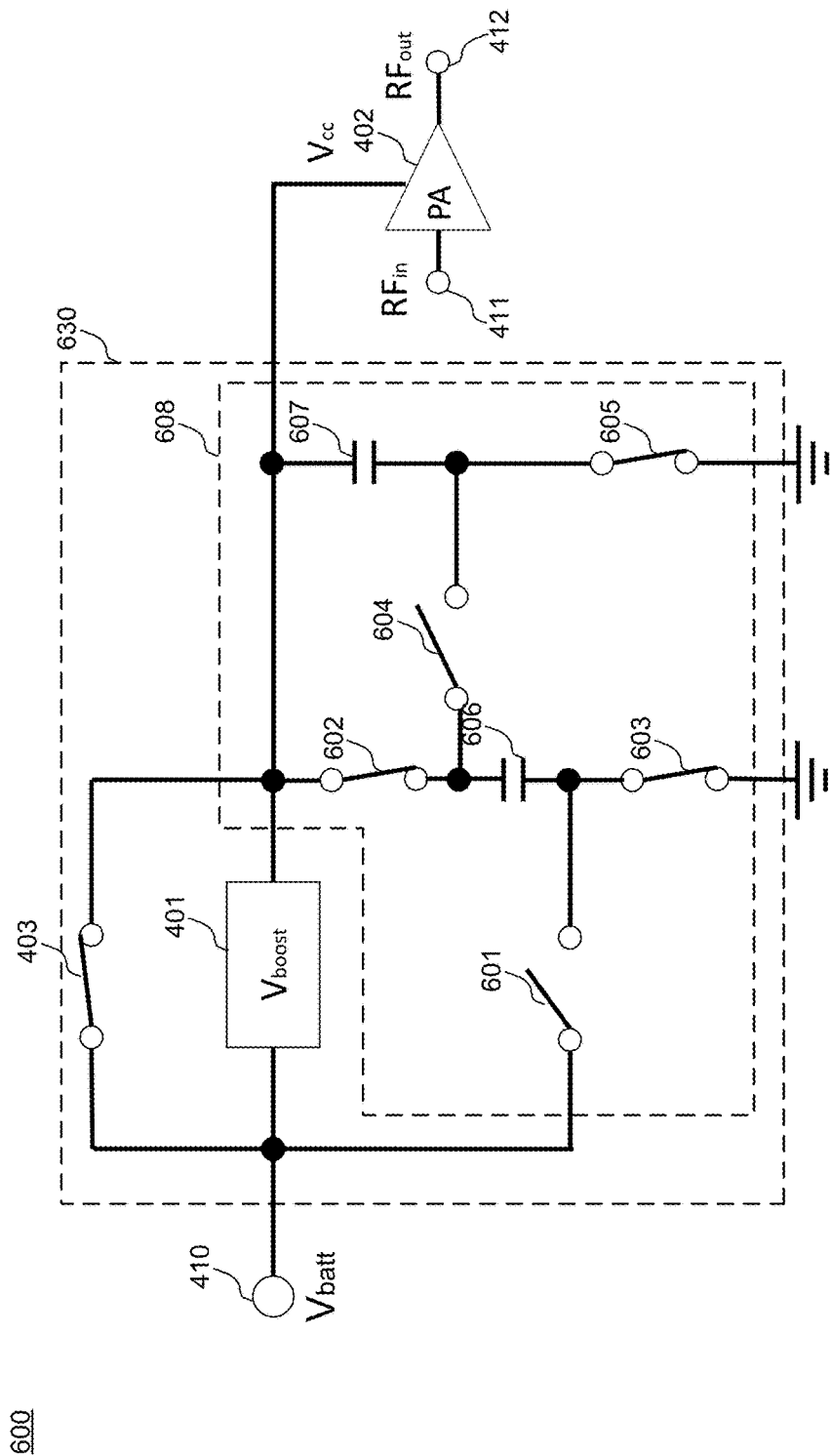
FIG. 6 is a block diagram of an example high-speed envelope tracking radio frequency power amplifier system, according to yet another embodiment.

FIG. 6 is a block diagram of an example high-speed envelope tracking radio frequency power amplifier system 600, according to yet another embodiment. The illustrated ET PA 600 comprises a high-speed envelope tracking power supply 630 and an RF PA 402. The envelope tracking power supply 630 is configured to provide a bias voltage Vcc to the RF PA 402 and comprises a boost DC converter 401, a bypass switch 403, a capacitive network 608, and a controller (not shown). The capacitive network 608 comprises switches 601 through 605 and capacitors 606 and 607. The controller controls the switches 601 through 605 as well as regulates the operations (i.e., switching on and off switches of the boost DC converter 401) of the boost DC converter 401. The controller typically is implemented as circuitry. The switches 601 through 605 may be MOSFET switches, silicon CMOS, SOI, or HEMT etc.

The illustrated envelope power supply 600 is similar to the envelope power supply 400 illustrated in FIG. 4, and thus the details of the ports 410-412, the bypass switch 403, the boost DC converter 401, and the RF PA 402 are omitted for the sake of brevity. The envelope tracking power supply 630 may provide different levels of DC bias voltage such that the RF PA 402 can maintain operation linearity and efficiency for RF signals at different power levels. Within the envelope tracking power supply 630, the capacitive network 608 is coupled between the port 410 and the RF PA 402. The capacitors 606 and 607 and the switches 601 through 605 are configured such that the capacitor 606 or the capacitor 606 along with the capacitor 607 can be coupled to be in series with the input DC voltage $V_{batt}$ via regulating the on and off of the switches 601 through 605.

When the input RF signal $RF_{in}$, level is low, the envelope power supply 600 operates at the low power mode, where envelope tracking power supply 630 provides a low voltage (i.e., the input DC voltage $V_{batt}$) for biasing the RF PA 402. The capacitive network 608 is decoupled from the input DC voltage $V_{batt}$ and the bypass switch 403 is on. During the low power mode, the switches 601 and 604 are off and the switches 602, 603 and 605 are on. Both capacitors 606 and 607 are charged by the input DC voltage $V_{batt}$. In addition, the controller regulates the boost converter to operate at a lower duty cycle D1 (e.g., 0%).

When the input RF signals $RF_{in}$, level is at a medium or high level, the envelope power supply 400 operates at a medium or high power mode, where the RF PA 402 is biased by a medium or high voltage (e.g., $2V_{batt}$ or $3V_{batt}$). When the input RF signal $RF_{in}$ transitions to the high level, the controller couples the capacitive network 608 to the input DC voltage $V_{batt}$, turns off the bypass switch 403, and regulates the boost DC converter 601 to operate at a higher duty cycle D (e.g., 50% or 67%). Accordingly, the DC bias voltage Vcc is increased to different levels and the RF PA 402 is ensured to amplify the input RF signal $RF_{in}$ at different levels. As such, the ET PA 600 is ensured to track the signal envelope of the input RF signal $RF_{in}$. When being coupled to the input DC voltage $V_{batt}$, the capacitive network 608 may be configured to provide different levels of boosting voltages (e.g., $V_{batt}$, or $2V_{batt}$). The DC bias voltage $V_{cc}$ can be increased instantaneously to various levels (e.g., $2V_{batt}$ or $3V_{batt}$) to meet different amount of power needed by the RF PA 402 to maintain linear operation.

As one example, when the RF input signal $RF_{in}$ transitions into the medium level, the controller turns off the switches 603 and 605 and subsequently turns off the bypass switch 403. Switch 604 was off and remains off. The controller subsequently turns on the switch 601 to couple the capacitor 606 to be in series with the input DC voltage $V_{batt}$. As such, the DC bias voltage Vcc is instantaneously boosted by the voltage across the capacitor 606.

As another example, when the RF input signal $RF_{in}$, transitions into a high level, to further boost the voltage, the controller turns off the switch 602 and subsequently turns on the switch 604. As such, the capacitor 607 is coupled in series with the capacitor 606, both of which are coupled in series with the input DC voltage $V_{batt}$. In both cases, the capacitor 606 or the capacitors 606 and 607 are discharged by supplying a current to the RF PA 402. The controller may regulate the boost DC converter 401 by increasing its duty cycle to stabilize the DC bias voltage Vcc.

When the RF input signal $RF_{in}$, transitions back from a higher level (e.g., the high level, or the medium level) to a lower level (e.g., the medium level, or the low level), the controller regulates the switches in a sequence reverse to the sequence as described above. For example, to lower the DC bias voltage Vcc to $V_{batt}$ from $3V_{batt}$, the controller turns off the switch 604 and subsequently turns on the switches 403, 602, 603, and 605.

Figure 7:
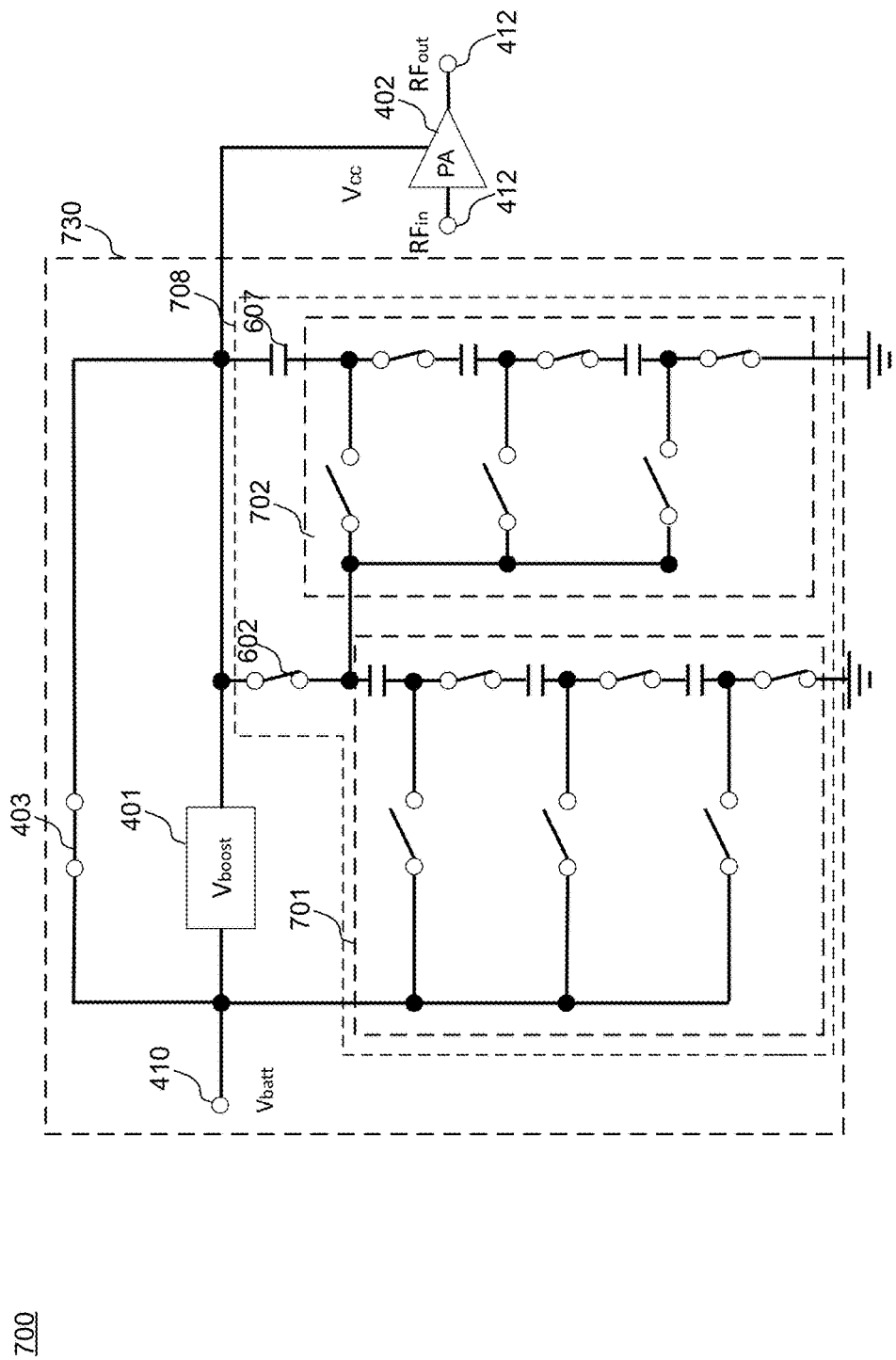
FIG. 7 is a block diagram of an example high-speed envelope tracking radio frequency power amplifier system, according to yet another embodiment.

The ET PA 600 can be adapted to include an envelope tracking power that can vary the output voltage in finer steps, such as the example illustrated in FIG. 7. FIG. 7 is a block diagram of an example high-speed envelope tracking radio frequency power amplifier system 700, according to yet another embodiment. The illustrated ET PA 700 comprises a high-speed envelope tracking power supply 730 and an RF PA 402. The envelope tracking power supply 730 is configured to provide a bias voltage Vcc to the RF PA 402 and comprises a boost DC converter 401, a bypass switch 403, a capacitive network 708, and a controller (not shown). The capacitive network 708 includes switch and capacitor ladders 701 and 702. Similar to the envelope power supply 600 illustrated in FIG. 6, the envelope power supply 700 may boost the DC bias voltage to different levels (e.g., $2V_{batt}$ and $3V_{batt}$). In addition, the envelope tracking power supply 730 can provide finer steps of voltage boosting. When being coupled to the input DC voltage $V_{batt}$, the capacitive network 708 may be configured to provide different levels of boosting voltages (e.g., $1/3*V_{batt}$, $2/3*V_{batt}$, $V_{batt}$, $4/3*V_{batt}$, $5/3*V_{batt}$, or $2V_{batt}$). The DC bias voltage $V_{cc}$ can be increased instantaneously to various levels (e.g., $4/3*V_{batt}$, $5/3*V_{batt}$, $2V_{batt}$, $7/3*V_{batt}$, $8/3*V_{batt}$, or $3V_{batt}$) to meet different amount of power needed by the RF PA 402 to maintain linear operation.

Upon reading this disclosure, those of skill in the art will appreciate still additional alternative designs for providing adaptive envelope tracking bias voltages to radio frequency power amplifiers. Thus, while particular embodiments and applications of the present disclosure have been illustrated and described, it is to be understood that the disclosure is not limited to the precise construction and components disclosed herein and that various modifications, changes and variations which will be apparent to those skilled in the art may be made in the arrangement, operation and details of the method and apparatus of the present disclosure disclosed herein without departing from the spirit and scope of the disclosure.

What is claimed is:

1. A cell phone comprising:
   a radio frequency ("RF") transmitter that transmits RF signals;
   an RF power amplifier that amplifies the RF signals; and
   an envelope tracking power supply having an input port and an output port, the input port for receiving a system supply voltage, the output port for providing a bias voltage to the RF power amplifier, wherein the bias voltage is equal to the system supply voltage when the RF power amplifier is operating at a first RF power that is less than a maximum RF power and the bias voltage is greater than the system supply voltage when the RF power amplifier is operating at the maximum RF power;
   wherein the envelope tracking power supply comprises:
      a capacitor circuit connected between the input port and the output port, the capacitor circuit including at least one boost capacitor and switching circuitry coupled with the boost capacitor;
      a controller operatively coupled with the capacitor circuit, the controller being adapted in a first mode of operation to configure the switching circuitry to disconnect the boost capacitor from the input port and to connect the boost capacitor across the output port, the controller being adapted in a second mode of operation to configure the switching circuitry to connect the boost capacitor in series with the input port so that the voltage across the boost capacitor is added directly to the system supply voltage to thereby generate a boosted supply voltage at the output port which is greater than the system supply voltage; and
      a direct current (DC) converter coupled with the capacitor circuit and the controller, the DC converter being disabled in the first mode, the DC converter being configured in the second mode to supply a current to the RF power amplifier for maintaining the boosted supply voltage;
   wherein in the first mode the envelope tracking power supply is configured to generate an output voltage at the output port that is equal to the system supply voltage, and in the second mode the envelope tracking power supply is configured to generate an output voltage at the output port that is equal to the boosted supply voltage; and
   wherein the capacitor circuit comprises a plurality of capacitors connected with the switching circuitry, the switching circuitry being configured in the first mode to disconnect the plurality of capacitors from the input port, the switching circuitry being configured in the second mode to selectably connect prescribed combinations of the plurality of capacitors between the input and output ports as a function of one or more control signals supplied by the controller so as to provide multiple voltage levels of the boosted supply voltage.

2. In a battery-powered device that communicates by transmitting radio frequency ("RF") signals, an envelope tracking power amplifier comprising:
   an RF power amplifier that amplifies the RF signals; and
   an envelope tracking power supply coupled with the RF power amplifier, the envelope tracking power supply having an input port and an output port, the input port for receiving a system supply voltage supplied to the envelope tracking power supply, the output port for providing a bias voltage to the RF power amplifier, wherein the bias voltage is equal to the system supply voltage when the RF power amplifier is operating at a first RF power level, and the bias voltage is greater than the system supply voltage when the RF power amplifier is operating at a second RF power level which is greater than the first RF power level;
   wherein the envelope tracking power supply comprises:
      a capacitor circuit connected between the input port and the output port, the capacitor circuit including at least one boost capacitor and switching circuitry coupled with the boost capacitor;
      a controller operatively coupled with the capacitor circuit, the controller being adapted in a first mode of operation to configure the switching circuitry to disconnect the boost capacitor from the input port and to connect the boost capacitor across the output port, the controller being adapted in a second mode of operation to configure the switching circuitry to connect the boost capacitor in series with the input port so that the voltage across the boost capacitor is added directly to the system supply voltage to thereby generate a boosted supply voltage at the output port which is greater than the system supply voltage; and
      a direct current (DC) converter coupled with the capacitor circuit and the controller, the DC converter being disabled in the first mode, the DC converter being configured in the second mode to supply a current to the RF power amplifier for maintaining the boosted supply voltage;
   wherein in the first mode the envelope tracking power supply is configured to generate an output voltage at the output port that is equal to the system supply voltage, and in the second mode the envelope tracking power supply is configured to generate an output voltage at the output port that is equal to the boosted supply voltage; and
   wherein the capacitor circuit comprises a plurality of capacitors connected with the switching circuitry, the switching circuitry being configured in the first mode to disconnect the plurality of capacitors from the input port, the switching circuitry being configured in the second mode to selectably connect prescribed combinations of the plurality of capacitors between the input and output ports as a function of one or more control signals supplied by the controller so as to provide multiple voltage levels of the boosted supply voltage.

3. The envelope tracking power amplifier of claim 2, wherein the first RF power level is equal to an average RF power level.

4. The envelope tracking power amplifier of claim 2, wherein the first RF power level is between 20% to 40% of the second RF power level.

5. The envelope tracking power amplifier of claim 2, wherein the first RF power level is less than 50% of the second RF power level.

6. The envelope tracking power amplifier of claim 2, wherein the first RF power level is approximately 200 mW.

7. The envelope tracking power amplifier of claim 2, wherein the system supply voltage equals a battery voltage.

8. The envelope tracking power amplifier of claim 2, wherein the system supply voltage is approximately 3.4V.

9. The envelope tracking power amplifier of claim 2, wherein the bias voltage is not less than the system supply voltage when the RF power amplifier is operating.

10. The envelope tracking power amplifier of claim 2, wherein the capacitor circuit is configured to be switched to provide the boosted supply voltage faster than the DC converter boosts the system supply voltage.

11. The envelope tracking power amplifier of claim 10, wherein the DC converter operates at a frequency that is slower than a speed of an envelope variation of the RF signal.

12. The envelope tracking power amplifier of claim 10, wherein the DC converter operates at a frequency that is several MHz.

13. The envelope tracking power amplifier of claim 10, wherein the RF signal operates at a frequency that is at least 10 MHz.

14. The envelope tracking power amplifier of claim 10, wherein the capacitor circuit provides a boosted supply voltage that is between 0× and 1× the system supply voltage.

15. The envelope tracking power amplifier of claim 2, wherein the envelope tracking power supply further comprises:
a bypass switch configured to selectively connect the input port with the output port as a function of at least one control signal.

16. An envelope tracking power amplifier for amplifying RF signals, comprising:
a radio frequency ("RF") power amplifier that amplifies an RF signal; and
an envelope tracking power supply coupled with the RF power amplifier, the envelope tracking power supply having an input port and an output port, the input port for receiving a system supply voltage, the output port for providing a bias voltage to the RF power amplifier, wherein the bias voltage is equal to the system supply voltage when the RF power amplifier is operating at a first RF power level, and the bias voltage is greater than the system supply voltage when the RF power amplifier is operating at a second RF power level which is greater than the first RF power level, the envelope tracking power supply comprising:
a capacitor circuit connected between an input port and an output port of the envelope tracking power supply, the capacitor circuit including at least one boost capacitor and switching circuitry coupled with the boost capacitor;
a controller operatively coupled with the capacitor circuit, the controller being adapted in a first mode of operation to configure the switching circuitry to disconnect the boost capacitor from the input port and to connect the boost capacitor across the output port, the controller being adapted in a second mode of operation to configure the switching circuitry to connect the boost capacitor in series with the input port so that the voltage across the boost capacitor is added directly to a first voltage supplied to the input port to thereby generate a boosted supply voltage at the output port which is greater than the first voltage; and
a direct current (DC) converter coupled with the capacitor circuit and the controller, the DC converter being disabled in the first mode, the DC converter being configured in the second mode to supply a current to the power amplifier for maintaining the boosted supply voltage;
wherein in the first mode the envelope tracking power supply is configured to generate an output voltage at the output port that is equal to the first voltage, and in the second mode the envelope tracking power supply is configured to generate an output voltage at the output port that is equal to the boosted supply voltage;
wherein the capacitor circuit comprises a plurality of capacitors connected with the switching circuitry, the switching circuitry being configured in the first mode to disconnect the plurality of capacitors from the input port, the switching circuitry being configured in the second mode to selectably connect prescribed combinations of the plurality of capacitors between the input and output ports as a function of one or more control signals supplied by the controller so as to provide multiple voltage levels of the boosted supply voltage.

17. The envelope tracking power amplifier of claim 16, wherein the envelope tracking power supply does not include a voltage step down converter, whereby the bias voltage is not less than the system supply voltage when the RF power amplifier is operating.

18. An envelope tracking power supply for biasing a radio frequency (RF) power amplifier, the envelope tracking power supply comprising:
a capacitor circuit connected between an input port and an output port of the envelope tracking power supply, the capacitor circuit including at least one boost capacitor and switching circuitry coupled with the boost capacitor;
a controller operatively coupled with the capacitor circuit, the controller being adapted in a first mode of operation to configure the switching circuitry to disconnect the boost capacitor from the input port and to connect the boost capacitor across the output port, the controller being adapted in a second mode of operation to configure the switching circuitry to connect the boost capacitor in series with the input port so that the voltage across the boost capacitor is added directly to a first voltage supplied to the input port to thereby generate a boosted supply voltage at the output port which is greater than the first voltage; and
a direct current (DC) converter coupled with the capacitor circuit and the controller, the DC converter being disabled in the first mode, the DC converter being configured in the second mode to supply a current to the power amplifier for maintaining the boosted supply voltage;

wherein in the first mode the envelope tracking power supply is configured to generate an output voltage at the output port that is equal to the first voltage, and in the second mode the envelope tracking power supply is configured to generate an output voltage at the output port that is equal to the boosted supply voltage;

wherein the capacitor circuit comprises a plurality of capacitors connected with the switching circuitry, the switching circuitry being configured in the first mode to disconnect the plurality of capacitors from the input port, the switching circuitry being configured in the second mode to selectably connect prescribed combinations of the plurality of capacitors between the input and output ports as a function of one or more control signals supplied by the controller so as to provide multiple voltage levels of the boosted supply voltage.

19. The envelope tracking power supply of claim 18, wherein the one or more control signals are generated by the controller based at least in part on an envelope of an input RF signal supplied to an input of the RF power amplifier.

* * * * *